United States Patent [19]

Schweizer

[11] Patent Number: 4,765,850

[45] Date of Patent: Aug. 23, 1988

[54] SINGLE CRYSTAL NICKEL-BASE SUPER ALLOY

[75] Inventor: Frederick A. Schweizer, San Diego, Calif.

[73] Assignee: Allied-Signal Inc., Morris Township, Morris County, N.J.

[21] Appl. No.: 569,633

[22] Filed: Jan. 10, 1984

[51] Int. Cl.[4] .............................................. C22C 19/05
[52] U.S. Cl. ..................................... 148/404; 148/410
[58] Field of Search .................. 148/404, 410, 428; 420/448

[56] References Cited

U.S. PATENT DOCUMENTS

| | | | |
|---|---|---|---|
| 3,171,739 | 3/1965 | Cape | 148/427 |
| 3,494,709 | 2/1970 | Piearcey | 148/404 |
| 3,837,933 | 9/1974 | Masumoto et al. | 148/404 |
| 3,887,363 | 6/1975 | Smashey et al. | 148/404 |
| 3,893,851 | 7/1975 | Culling | 420/451 |
| 3,922,168 | 11/1975 | Restall et al. | 420/448 |
| 3,988,118 | 10/1976 | Grierson et al. | 420/430 |
| 4,012,241 | 3/1977 | Lemkey | 148/404 |
| 4,019,899 | 4/1977 | Negishi et al. | 420/441 |
| 4,116,723 | 9/1978 | Gell et al. | 148/404 |
| 4,153,455 | 5/1979 | Eiselstein et al. | 420/448 |
| 4,169,726 | 10/1979 | Fairbanks | 148/404 |
| 4,205,985 | 6/1980 | Yamazaki et al. | 420/448 |
| 4,209,348 | 6/1980 | Duhl et al. | 148/410 |
| 4,222,794 | 9/1980 | Schweizer et al. | 148/404 |
| 4,248,629 | 2/1981 | Pons et al. | 420/446 |
| 4,328,045 | 5/1982 | Pearson et al. | 148/404 |
| 4,371,404 | 2/1983 | Duhl et al. | 148/162 |
| 4,388,124 | 6/1983 | Henry | 148/404 |

FOREIGN PATENT DOCUMENTS

| | | |
|---|---|---|
| 2374427 | 9/1977 | France . |
| 2406001 | 7/1978 | France . |
| 1557900 | 12/1979 | United Kingdom . |
| 1562082 | 3/1980 | United Kingdom . |

Primary Examiner—R. Dean
Attorney, Agent, or Firm—R. Steven Linne; James W. McFarland

[57] ABSTRACT

A single crystal nickel-base super alloy is disclosed having good high temperature strength with improved metallurgical stability and environmental resistance. The single crystal alloy of this invention is characterized by the addition of rhenium for high temperature strength, the inclusion of cobalt to increase metallurgical stability by inhibiting the formation of sigma phase, and the ellimination of vanadium to enhance hot corrosion resistance. The nominal composition of my new single crystal alloy is 8-10% Co, 5% Cr, 2% Mo, 5% W, 3% Re, 5.5% Al, 1.5% Ti, 6.3% Ta, and the balance Nickel.

5 Claims, 2 Drawing Sheets

STESS-RUPTURES LIVES OF CANDIDATE SC ALLOY

MICROSTRUCTURE STABILITY OF SC ALLOYS CONTAINING Re AND 10-PERCENT COBALT.

SINGLE CRYSTAL NICKEL-BASE SUPER ALLOY

BACKGROUND OF THE INVENTION

Nickel base cast alloys have been extensively used for turbine parts and component designs requiring high temperature strength and corrosion resistance, for use at temperatures in excess of 1800° F. (982° C.). Single crystal casting techniques have been developed for the manufacture of gas turbine blades and permit alloys compositions to be further optimized for high temperature strength by removal of grain strengthening elements such as carbon, boron and ziconium, which adversely affect heat treatability. The primary strengthening mechanism of nickel base super alloys cast in single crystal components, is the formation of the intermetallic gamma prime phase, $Ni_3(Al, Ti)$. The stress-rupture life of such single crystal components, is a function of the volume fraction of fine gamma prime particles in the microstructure.

Removal of grain boundary strenghtening elements such as B, Zr, Hf, and C (which are also melting point depressants) resulted in an increase in the incipient melting point from about 2265° F. (1240° C.) to about 2425° F. (1330° C.). This increase was sufficient to permit the originally cast gamma prime phase to be almost completely solutioned and then reprecipitated as fine particles for maximum strength. The complete solutioning and reprecipitation of the gamma prime resulted in single crystal alloys with 25°-100° F. (38° C.) temperature improvement in the 30 to 50 KSI stress-rupture life range over prior alloys.

Rhenium additions to nickel-base super alloys has been found to be a successful alloying approach to achieve further high temperature strength improvements for blading alloys.

It is an object of my present invention to provide a rhenium containing single crystal nickel-base alloy article having a combination of improved stress-rupture life, metallurgical phase stability and good environmental resistance. These and other objects are realized by my present invention as will be appreciated from the following description of my invention.

DISCUSSION OF THE PRIOR ART

Four patents were located in the prior art relating to nickel-base superalloys free of grain boundary strengthening elements, i.e. C, B, Zr, Hf, i.e. U.S. Pat. Nos. 3,888,363 Smashey et al; 4,116,723 Gell et al; 4,209,348 Duhl et al; and 4,222,794 Schweizer et al.

The Smashey et al patent discloses a nickel-base superalloy addressed to the improvement of stress-rupture and creep properties in a unidirectionally solidified cast article, characterized by the substantial absence of titanium. This alloy also has up to 7% vanadium. In the alloy of my present invention, titanium is essential as a gamma prime forming element, and vanadium is eliminated to enhance hot corrosion resistance.

The Gell et al patent, discloses a nickel-base superalloy single crystal material which is essentially free of cobalt in order to prevent formation of TCP (topologically close packed) phases from the material's microstructure. This approach, however, has not been successful with rhenium containing single crystal alloys. The alloys of my present invention requires 8-10% cobalt to lend metallurgical stability to the material by inhibiting formation of sigma phase.

Pat. No. 4,209,348 is also a nickel-base superalloy single crystal material which contains 3-7% cobalt but is essentially free of molybdenum and rhenium, key alloying ingredients in my present alloy.

Pat. No. 4,222,794 of which I am co-inventor, describes an alloy having zero to 7% cobalt, 0.8 to 1.5% titanium and 0.2-0.6% vanadium. My present alloy has an increased amount of cobalt, i.e. 8-12% versus 0-7% in my prior patent, to prevent the formation of a chromium/rhenium rich sigma phase which may degrade long term tensile, fatigue, creep and stress-rupture properties. My prior patent also describes a 0.8-1.5% titanium content, versus 1.2-1.8% for my present patent, to insure adequate gamma prime volume fractions and solid solution strengthening, and to enhance hot corrosion resistance. My prior patent No. 4,222,794 also contains 0.2-0.6% vanadium which I have found will degrade hot corrosion resistance.

SUMMARY OF THE INVENTION

My present invention is an improved single crystal nickel-base superalloy which has demonstrated significantly superior stress-rupture life in the 1800° F. (982° C.) to 2000° F. (1093° C.)/36 KSI temperature range to comparable base line single crystal nickel-base superalloys which were evaluated. In accordance with my present invention, a single crystal nickel-base superalloy composition is modified with rhenium additions coupled with the removal of vanadium. The addition of rhenium in the 2 to 3 weight percent range has the primary effect, at these concentrations, of (1) refining the size of the gamma prime precipitates and (2) retarding the rate of gamma prime coarsening during stress-rupture tests.

Cobalt is an essential ingredient in the alloys of my present invention since in the nickel-base superalloy compositions, cobalt is found to inhibit the formation of the sigma phase which is a brittle intermetallic compound which is precipitated from the gamma matrix phase. The inhibition of the sigma phase formation increases the metallurgical stability of the alloy. It was discovered that in rhenium containing alloys, the cobalt increases the solubility of rhenium in the gamma prime phase, thereby preventing formation of the undesirable chromium/rhenium phase.

The single crystal alloys of my present invention are substantially devoid of the grain boundary strengthening elements such as C, B, Zr, and Hf, since these elements are melting point depressants, which if left in the alloy would prevent optimum strengthening through complete gamma-prime solutioning.

Although the addition of chromium to nickel-base superalloys improves the environmental resistance of such alloys, e.g. hot corrosion resistance, larger amounts of chromium compromise the high temperature strength, i.e. the stress-rupture life. Large concentrations of chromium also favor the formation of the sigma phase. I have found in accordance with my present invention, however, that the chromium content can be held at about 4.5-6% and the environmental resistance improved by the removal of vanadium from the alloy. The removal of vanadium permits an increase in the titanium content without reaching the metallurgical instability limit, titanium being a gamma prime forming element which increases the environmental resistance of the alloy. Al, Ta, W, and Nb are also important gamma prime forming elements.

DESCRIPTION OF THE PREFERRED EMBODIMENTS

In accordance with my present invention, the composition of a nickel-base single crystal superalloy is modified to obtain a significant improvement in the high temperature mechanical properties, i.e. the stress-rupture life by first removing grain boundary strengthening elements such as B and Zr which are also melting point depressants, thus permitting the gamma prime in the alloy to be almost completely solutioned to obtain realization of the full strengthening potential of the gamma prime in the alloy. (It was previously known that stress-rupture life is increased in accordance with the volume fraction of fine gamma prime in the alloy microstructure). Secondly, the alloy of my present invention has been modified as compared to the alloy of my previous Pat. No. 4,222,794, which shows rhenium additions, but by an increase in cobalt and the removal of vanadium. The composition of my alloy is 4.5-6% Cr; 8-12% Co; 5-5.8% Al; 1.2-1.8% Ti; 1.7-2.3% Mo; 4-6% W; 5.5-8% Ta; 1-4% Re; balance Ni. Vanadium which is deleterious to the hot corrosion properties of my alloy, and the grain boundary strengthening elements B, Zr, and C, are excluded from the compositions of the present alloy and would be present only as impurities.

In accordance with my present invention the alloys were cast into single crystal turbine blades in accordance with one of the prior art single crystal casting or solidification techniques, for example, the withdrawal process or the exothermal process. Following solidification to the preferred primary crystallographic orientation (e.g. [001]), the cast components are heat treated by conventional single crystal heat treatment, e.g. solution or homogenization heat treatment to a temperature between the gamma prime solvus and the incipient melting temperature (i.e. at 2400° F. (1315° F.) for 3 hours), followed by a simulated coating process post-heat treatment (e.g. heating to 1800°-1900° F. for 4-8 hours), and precipitation heat treatment (e.g. 1600° F. (871° C.) for approximately 20 hours) to precipitate all of the remaining gamma prime phase out of solution.

EXAMPLES

Proposed single crystal alloys were cast into high pressure gas turbine blades using 35 pound master heats with additions of Re, Mo and W added to the alloy at the casting source during melting in the crucible. The alloys compositions of my present invention are shown in Table 1 including the comparative composition of closely related alloys disclosed in the prior art literature, i.e. MAR-M 247, NASAIR 100 and the alloy of my Pat. No. 4,222,794.

TABLE I

COMPOSITIONS OF CANDIDATE SECOND-GENERATION SINGLE-CRYSTAL ALLOYS (WEIGHT %)

| Alloy | Cb | Mo | W | Ta | Re | Al | Ti | Cr | Co | Ni |
|---|---|---|---|---|---|---|---|---|---|---|
| MAR-M 247* | — | 0.65 | 10.0 | 3.3 | — | 5.5 | 1.05 | 8.4 | 10.0 | |
| NASAIR 100 | — | 1.0 | 10.5 | 3.3 | — | 5.75 | 1.2 | 9.0 | — | |
| 203** | — | 2.0 | 4.9 | 6.4 | 3.0 | 5.4 | 1.1 | 5.2 | — | 0.4 V Bal. |
| 120 | — | 2.0 | 5.0 | 6.3 | 2.0 | 5.5 | 1.5 | 5.0 | 10.0 | Bal. |
| 125 | — | 2.0 | 5.0 | 6.3 | 2.5 | 5.5 | 1.5 | 5.0 | 5.0 | Bal. |
| 130 | — | 2.0 | 5.0 | 6.3 | 3.0 | 5.5 | 1.5 | 5.0 | 10.5 | Bal. |
| 406 | 2.0 | 1.0 | 8.5 | 6.0 | — | 4.5 | 2.0 | 6.0 | 10.0 | Bal. |
| 406 Re | 2.0 | 1.0 | 7.0 | 4.3 | 2.5 | 4.5 | 1.9 | 5.0 | 10.0 | Bal. |

*Also contain 1.4 Hf, 0.055 Zr, 0.15 C and 0.15 B
**F. A. Schweizer, et al, U.S. Pat. No. 4,222,794

Single crystal articles of alloys SC 130, SC 120 and SC 125 were produced using both the withdrawal and the exothermic single crystal casting processes. The exothermic process is a known prior art process which derives its name from the use of heat released during the exothermic reaction between aluminum and iron oxide finely dispersed in briquets or nuggets. This heat is used to preheat a ceramic investment casting shell mold to a temperature above the melting point of the alloy. After pre-heating, the mold is placed on a water-cooled copper chill to establish unidirectional heat extraction conditions. The alloy is then cast into the mold and directionally solidified. A geometric crystal selector is placed in the ceramic shell at a position between the starter block and the blade cavity. The crystal selector is designed to permit only one properly oriented grain to enter the blade cavity of the mold. The formation of articles by single crystal formation in accordance with prior art solidificated techniques is described, for example, in U.S. Pat. No. 3,494,709.

The withdrawal process is described in the ASM publication entitled "Superalloys 1980—Proceedings of the Fourth International Symposium on Superalloys" Tien et al.

Subsequent to casting, all castings were grit blasted, macroetched and grain inspected to check for the presence of stray grains and crystal orientation. One blade from each mold was chemically analyzed to verify the single crystal alloy composition.

The single crystal blades formed were heat treated by solution heat treating to a temperature shown in Table II followed by treatment at 1800° F. (987° C.) for 5 hours followed by 1600° F. (871° C.) for 20 hours. Table II shows the solution heat treatment study results for the alloys under consideration.

TABLE II

SOLUTION HEAT TREATMENT OF ADVANCED SC ALLOYS

| Alloy | Gamma Prime Solvus | Incipient Melting | Solution Heat Treatment |
|---|---|---|---|
| SC 125 | 2400° F. (1815° C.) | 2425° F. (329° C.) | 2400° F./3 hrs. |
| SC 120 | 2375° F. (1301° C.) | 2425° F. | 2400° F./3 hrs. |
| SC 130 | 2375° F. | 2425° F. | 2400° F./3 hrs. |
| SC 406 Re | 2375° F. | 2375° F. | 2350° F. (1288° C.)/3 hrs. |

The data in Table II shows that Alloy SC 406 Re which has 1.9% Ti, which is outside the range of my present alloy, is not heat treatable since the difference between the gamma prime solvus temperature and the incipent melting temperature is nil. Apparently the increase in Ti in 406 Re alloy reduces the incipient melting temperature. Thus it is significant to note that relatively minor composition variations in respect to the alloys of my present invention, may have marked effects on the alloy properties.

Longitudinal minibar test specimens, 0.070 inch gauge diameter, were machined from each of the alloy blades for stress-rupture testing. The stress-rupture tests were run at 1800° F. (982° C.)—at a 36 KSI stress, 2000° F. (1093° C.) at 18 KSI stress and 1600° F. (871° C.) at stress values ranging from 13.5 KSI to 55 KSI and the results of these stressed are tabularized in Tables III, IV & V with typical data for prior art alloy, SC NASAIR 100 and MAR-M 247, provided for comparison.

TABLE III

STRESS-RUPTURE RESULTS ON 0.070-INCH DIAMETER SPECIMENS MACHINED FROM CANDIDATE SC ALLOY TURBINE BLADES

| Alloy | Temperature (°F.) | Stress (ksi) | Rupture Life (hours) | Elongation (%) | R of A (%) |
|---|---|---|---|---|---|
| SC 120 | 1800 (982° C.) | 36 | 157.7 | 27.6 | 43.7 |
| SC 120 | 1800 | 36 | 160.9 | 20.8 | 37.5 |
| SC 125 | 1800 | 36 | 135.1 | 35.0 | 41.8 |
| SC 125 | 1800 | 36 | 122.0 | 25.5 | 37.0 |
| SC 125 | 1800 | 36 | 132.3 | 33.8 | 34.7 |
| SC 130 | 1800 | 36 | 184.2 | 23.1 | 30.3 |
| SC 130 | 1800 | 36 | 205.3 | 21.9 | 38.9 |
| SC 130 | 1800 | 36 | 191.9 | 15.3 | 27.8 |
| SC 130 | 1800 | 36 | 199.2 | 28.5 | 39.6 |
| SC 406 Re | 1800 | 36 | 129.2 | 27.1 | 36.4 |
| SC 406 Re | 1800 | 36 | 164.8 | 22.2 | 38.7 |
| SC 406 Re | 1800 | 36 | 164.5 | 31.5 | 43.7 |
| NASAIR 100 | 1800 | 36 | 39.0 | | |
| D.S. MarM 247 | 1800 | 36 | 70.0 | | |

TABLE IV

STRESS-RUPTURE RESULTS ON 0.070-INCH DIAMETER SPECIMENS MACHINED FROM CANDIDATE SC ALLOY TURBINE BLADES

| Alloy | Temperature (°F.) | Stress (ksi) | Rupture Life (hours) | Elongation (%) | R of A (%) |
|---|---|---|---|---|---|
| SC 120 | 2000 (1093° C.) | 18 | 183.8 | 16.5 | 25.3 |
| SC 120 | 2000 | 18 | 200.0 | 15.1 | 23.2 |
| SC 125 | 2000 | 18 | 122.0 | 23.8 | 29.4 |
| SC 125 | 2000 | 18 | 124.0 | 20.9 | 34.7 |
| SC 130 | 2000 | 18 | 364.1 | 8.1 | 15.3 |
| SC 130 | 2000 | 18 | 326.3 | 9.1 | 13.1 |
| SC 130 | 2000 | 18 | 346.0 | 6.6 | 8.0 |
| SC 130 | 2000 | 18 | 231.9 | 16.1 | 32.1 |
| SC 130 | 2000 | 18 | 210.7 | 14.3 | 17.6 |
| SC 130 | 1600 | 75 | 244.9 | 21.4 | 32.0 |
| SC 130 | 1600 | 75 | 214.1 | 19.1 | 38.2 |
| SC 406 Re | 2000 | 18 | 181.9 | 18.2 | 32.4 |
| SC 406 Re | 2000 | 18 | 196.0 | 14.0 | 39.3 |
| SC 406 Re | 2000 | 18 | 195.0 | 17.3 | 29.8 |
| NASAIR 100 | 2000 | 18 | 120.0 | | |
| DS-MarM 247 | 2000 | 18 | 20.0 | | |
| NASAIR 100 | 1600 | 18 | 70.0 | | |
| DS MarM | 1600 | 75 | 23.0 | | |

FIG. 1 indicates that alloy SC 130 which represent the alloys of my present invention, demonstrate superior rupture as compared to prior art single crystal alloys tested.

As shown in FIG. 2 the stress-rupture life of the alloy of my present invention, alloy 130, is markedly superior in rupture life as compared to the other single crystal alloys.

Figure 1:
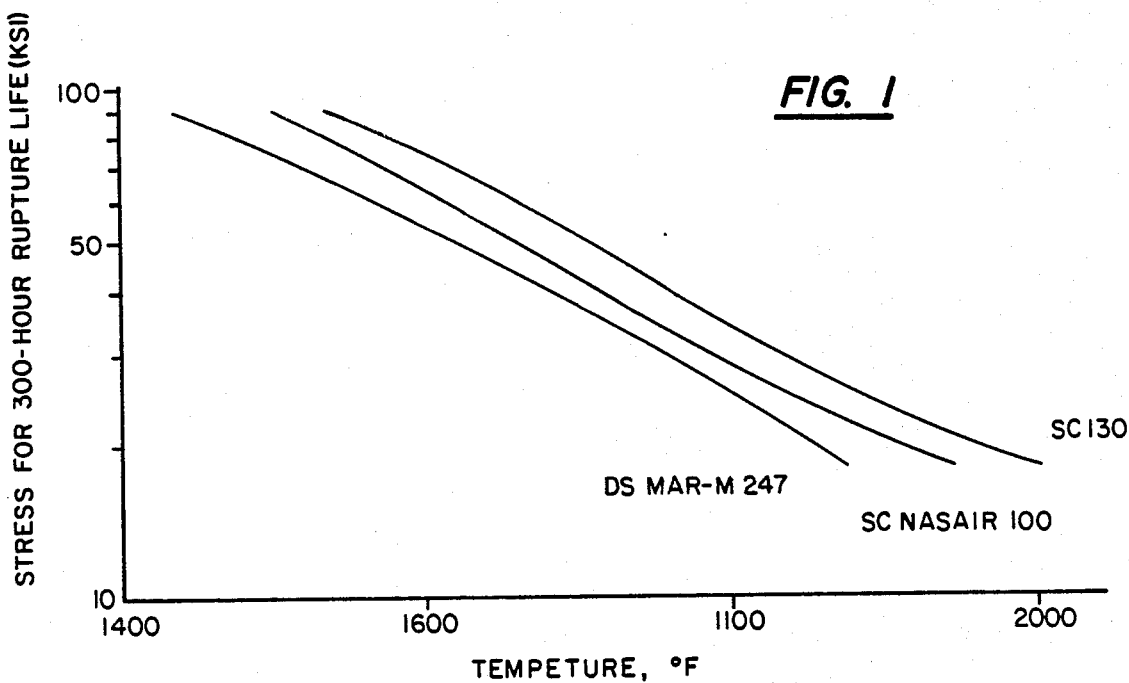
FIG. 1 shows the stress values for a given rupture life of 300 hours versus test temperature.
Figure 2:
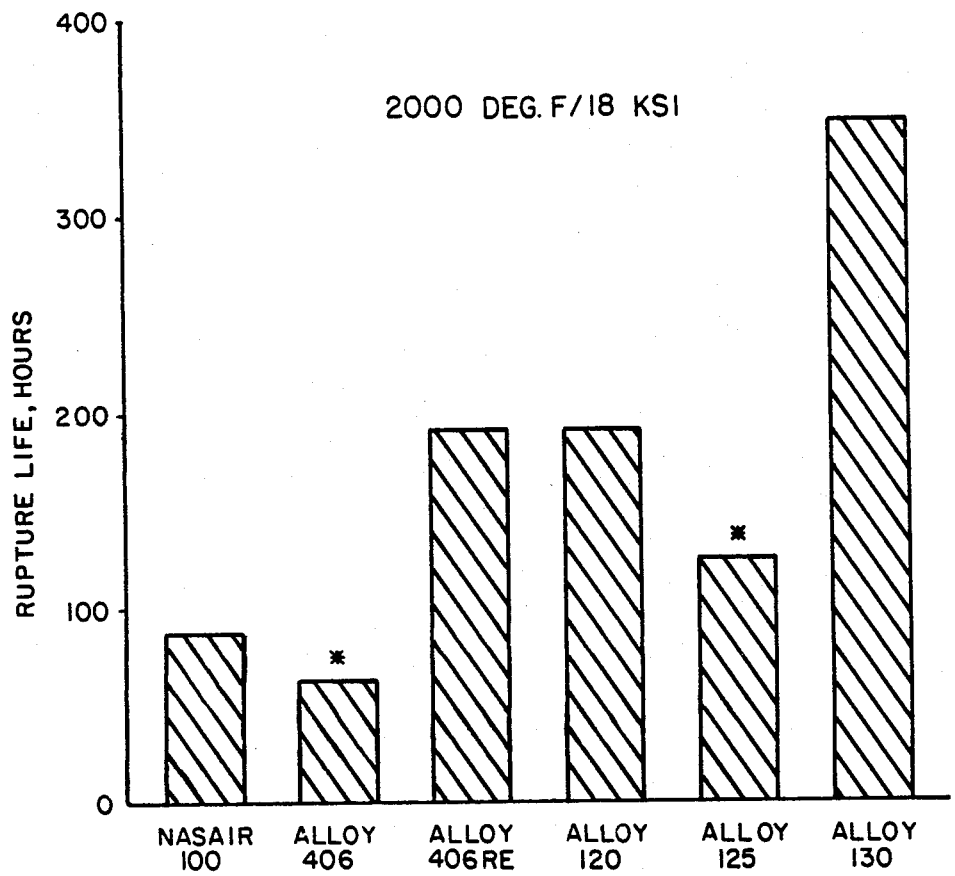
FIG. 2 shows a bar graph showing the comparative rupture life of the various alloys tested, in comparison with the alloys of my present invention, tested at 2000° F. (1093° C.) at 18 KSI stress loading.
Figure 3:
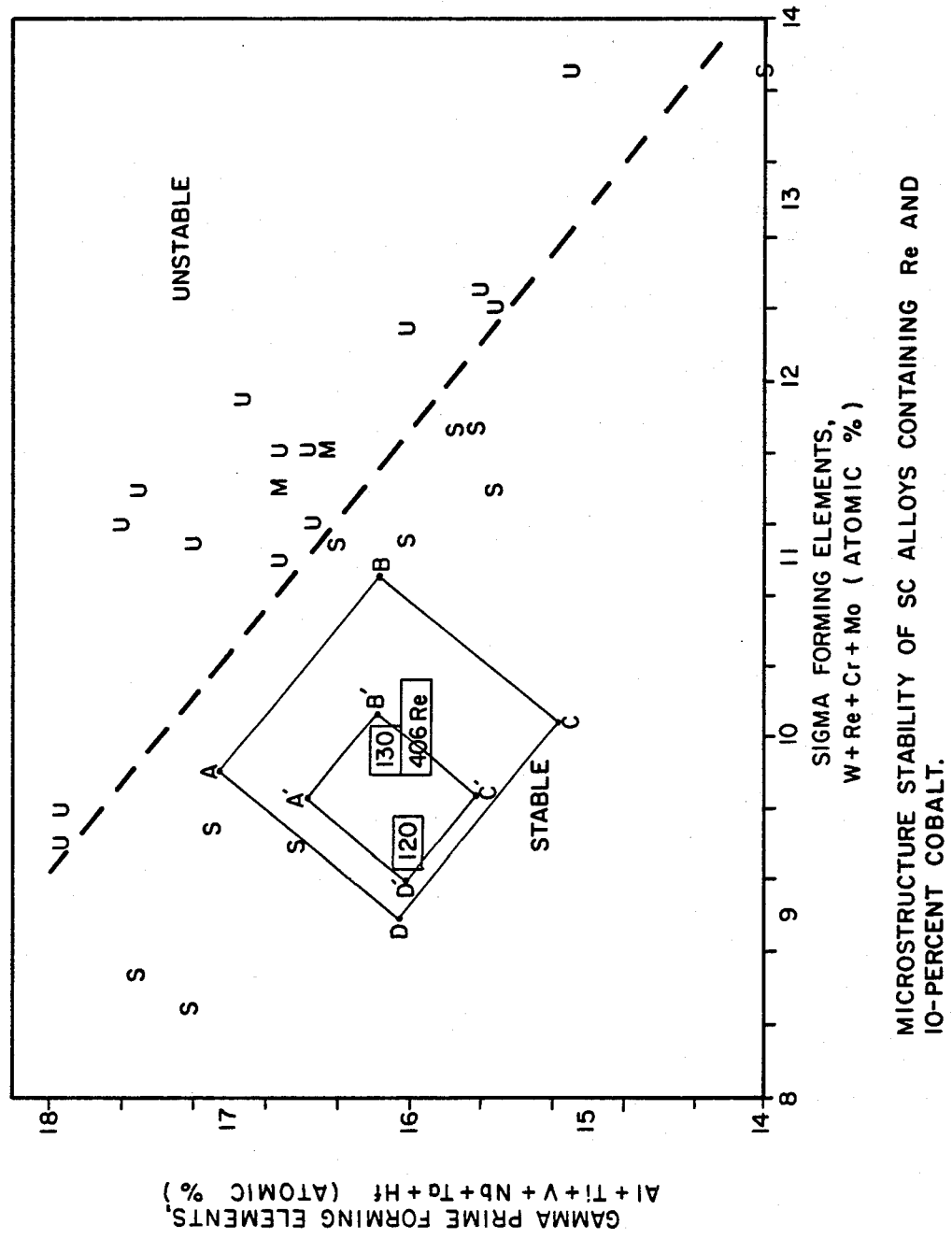

FIG. 3 shows the metallurgical stability of various single crystal alloys containing Re and 10% Co, including the alloys of my present invention and prior art alloys reported in the metallurgical literature, by plotting the atomic % of the total gamma prime forming elements (Al, Ti, V, Nb, Ta and Hf) versus the total of the sigma forming elements (W, Re, Cr, Mo). The stable alloys are within the portion of FIG. 3 bounded by the points A, B, C and D. Alloy compositions approaching a line drawn between points A and B become stronger but less stable, whereas alloys approaching the line drawn between points C and D become more stable but weaker. As may be seen from FIG. 3, the alloy compositions of SC 120, SC 130 and SC 406 Re are well within the stable alloy zone. The preferred range is within the sub-area A'B'C'D' shown on FIG. 3 and it is noted that my alloys 120 and 130 fall within this preferred range.

While my present invention has been described herein with a certain degree of particularity in reference to certain specific alloy compositions which were formulated and tested, it is to be understood that the scope of my invention is not to be so limited, but should be afforded the full scope of the appended claims.

I claim:

1. A single crystal nickel-base super alloy article for use at elevated temperatures, characterized by resistance to hot corrosion, and having a stress-rupture life at 2000° F. at 18 KSI stress load in excess of 150 hours and being substantially free of precipitated sigma phase in the alloy microstructure, said alloy consisting essentially of the composition: 1–4% Re, 8–12% Co, 4.5–6% Cr, 5–5.8% Al, 1.2–1.8% Ti, 1.7–2.3% Mo, 4–6% W, 5.5–8% Ta, balance Ni and being substantially free of V.

2. The article of claim 1 having an alloy composition falling with the points A-B-C-D of FIG. 3 hereof.

3. The article of claim 1 having an alloy composition falling within the points A'B'C'D' of FIG. 3 hereof.

4. The article of claim 1 with said alloy composition consisting essentially of about: 2.0% Re, 10.0% Co, 5.0% Cr, 5.5% Al, 1.5% Ti, 2.0% Mo, 5.0% W, 6.3% Ta, balance Ni plus usual impurities.

5. The article of claim 1 with said alloy composition consisting essentially of about: 3.0% Re, 10.5% Co, 5.0% Cr, 5.5% Al, 1.5% Ti, 2.0% Mo, 5.0% W, 6.3% Ta, balance Ni plus usual impurities.

* * * * *